(12) United States Patent  (10) Patent No.: US 7,890,989 B1
Hofrichter et al.  (45) Date of Patent: Feb. 15, 2011

(54) AUTOMATED CONTEXT-SENSITIVE UPDATING ON CONTENT IN AN AUDIOVISUAL STORAGE SYSTEM

(75) Inventors: Klaus Hofrichter, Santa Clara, CA (US); Rob Myers, Santa Cruz, CA (US); Richter A. Rafey, Santa Clara, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 2030 days.

(21) Appl. No.: 09/696,609

(22) Filed: Oct. 24, 2000

(51) Int. Cl.
*H04N 7/16* (2006.01)

(52) U.S. Cl. .................. 725/134; 725/131; 725/139; 725/142; 725/151; 386/83; 386/1; 386/46

(58) Field of Classification Search .......... 725/131, 725/134, 139, 142, 151; 386/83, 1, 46; *H04N 7/16*
See application file for complete search history.

(56) References Cited

U.S. PATENT DOCUMENTS

| | | | |
|---|---|---|---|
| 4,745,549 A | 5/1988 | Hashimoto | |
| 4,965,825 A | 10/1990 | Harvey et al. | |
| 5,146,552 A | 9/1992 | Cassorla et al. | |
| 5,223,924 A | 6/1993 | Strubbe | |
| 5,231,494 A | 7/1993 | Wachob | |
| 5,307,456 A | 4/1994 | MacKay | 395/154 |
| 5,371,551 A | 12/1994 | Logan et al. | |
| 5,469,206 A | 11/1995 | Strubbe et al. | |
| 5,481,296 A | 1/1996 | Cragun et al. | |
| 5,483,277 A | 1/1996 | Granger | |
| 5,534,911 A | 7/1996 | Levitan | |
| 5,553,281 A | 9/1996 | Brown et al. | |
| 5,614,940 A | 3/1997 | Cobbley et al. | |
| 5,619,249 A | 4/1997 | Billock et al. | |
| 5,625,464 A | 4/1997 | Compoint et al. | |
| 5,635,979 A | 6/1997 | Kostreski et al. | |
| 5,740,549 A | 4/1998 | Reilly et al. | |
| 5,754,938 A | 5/1998 | Herz et al. | |

(Continued)

OTHER PUBLICATIONS

Electronic House Com, EchoStart Communications Corporation and Geocast Network Systems Align to Deliver New Personalized Interactive Broadband Services to PC Users Via Satellite, Jun. 4, 2002, http://209.6.10.99/news101600echostar.html, 3 pages.

(Continued)

*Primary Examiner*—Jason P Salce
(74) *Attorney, Agent, or Firm*—Blakely, Sokoloff, Taylor & Zafman LLP (57) ABSTRACT

Automated context-sensitive updating of content in an audiovisual (AV) storage system is disclosed. A media storage device for storing a multimedia signal includes a storage medium, such as a dedicated hard drive, a processor, and memory. The storage medium is coupled to the processor and the memory. The memory contains instructions that, when implemented, enable a method of off-site management of data stored on the storage medium. The method includes a step of receiving a media signal with content data and context data at the media storage device. The method also includes a step of receiving storage management instructions from a storage management provider, remotely located from the media storage device. Lastly, the media signal is stored on the media storage device in accordance with the storage management instructions.

33 Claims, 6 Drawing Sheets

U.S. PATENT DOCUMENTS

| | | | |
|---|---|---|---|
| 5,758,257 | A | 5/1998 | Herz et al. |
| 5,797,010 | A | 8/1998 | Brown |
| 5,798,785 | A | 8/1998 | Hendricks et al. |
| 5,801,747 | A | 9/1998 | Bedard |
| 5,818,510 | A * | 10/1998 | Cobbley et al. ............. 725/139 |
| 5,826,102 | A | 10/1998 | Escobar et al. |
| 5,852,435 | A | 12/1998 | Vigneaux et al. |
| 5,861,881 | A | 1/1999 | Freeman et al. |
| 5,861,906 | A | 1/1999 | Dunn et al. |
| 5,884,056 | A | 3/1999 | Steele |
| 5,884,298 | A | 3/1999 | Smith et al. .................... 707/2 |
| 5,889,958 | A * | 3/1999 | Willens ...................... 709/229 |
| 5,890,172 | A | 3/1999 | Borman et al. |
| 5,892,535 | A | 4/1999 | Allen et al. .................... 348/9 |
| 5,956,716 | A * | 9/1999 | Kenner et al. ................ 707/10 |
| 5,968,109 | A | 10/1999 | Israni et al. ................ 701/208 |
| 6,020,883 | A | 2/2000 | Herz et al. |
| 6,029,045 | A | 2/2000 | Picco et al. |
| 6,047,327 | A | 4/2000 | Tso et al. |
| 6,064,380 | A | 5/2000 | Swenson et al. |
| 6,084,581 | A | 7/2000 | Hunt |
| 6,144,375 | A | 11/2000 | Jain et al. |
| 6,157,924 | A | 12/2000 | Austin |
| 6,182,050 | B1 | 1/2001 | Ballard |
| 6,236,395 | B1 * | 5/2001 | Sezan et al. ................ 715/723 |
| 6,269,369 | B1 | 7/2001 | Robertson |
| 6,289,346 | B1 | 9/2001 | Milewski et al. |
| 6,353,704 | B1 | 3/2002 | Nakatani et al. ............ 386/126 |
| 6,366,296 | B1 | 4/2002 | Boreczky et al. |
| 6,401,242 | B1 * | 6/2002 | Eyer et al. .................... 725/35 |
| 6,427,164 | B1 | 7/2002 | Reilly |
| 6,442,144 | B1 | 8/2002 | Hansen et al. |
| 6,460,036 | B1 | 10/2002 | Herz |
| 6,463,444 | B1 | 10/2002 | Jain et al. |
| 6,473,751 | B1 | 10/2002 | Nikolovska et al. |
| 6,483,986 | B1 | 11/2002 | Krapf |
| 6,549,217 | B1 | 4/2003 | De Greef et al. |
| 6,567,980 | B1 | 5/2003 | Jain et al. |
| 6,574,378 | B1 | 6/2003 | Lim |
| 6,614,987 | B1 * | 9/2003 | Ismail et al. ................... 386/83 |
| 6,662,177 | B1 | 12/2003 | Martino et al. |
| 6,728,713 | B1 | 4/2004 | Beach et al. |
| 6,732,366 | B1 * | 5/2004 | Russo ............................ 725/5 |
| 6,757,691 | B1 | 6/2004 | Welsh et al. |
| 6,763,386 | B2 | 7/2004 | Davis et al. |
| 6,807,574 | B1 | 10/2004 | Partovi et al. |
| 6,826,592 | B1 | 11/2004 | Philyaw et al. |
| 2001/0021994 | A1 | 9/2001 | Nash |
| 2002/0023230 | A1 | 2/2002 | Bolnick et al. |
| 2002/0056093 | A1 * | 5/2002 | Kunkel et al. ................. 725/35 |
| 2002/0083451 | A1 | 6/2002 | Gill et al. |
| 2003/0088872 | A1 | 5/2003 | Maissel et al. |
| 2005/0160357 | A1 | 7/2005 | Rivette et al. |

OTHER PUBLICATIONS

Lost Remote, The TV Revolution is Coming, Lost Remote TV News Media & Television Convergence News, TV News Gets (too?) Personal by Cory Bergman, Sep. 25, 2000, http://www.lostremote.com/producer/personal.html, 2 pages.

* cited by examiner

AUTOMATED CONTEXT-SENSITIVE UPDATING ON CONTENT IN AN AUDIOVISUAL STORAGE SYSTEM

TECHNICAL FIELD

The field of the present invention pertains to a method and apparatus for updating content in an audiovisual (AV) storage system. In particular, the present invention relates to the field of automated remote management of content stored in an on-site AV storage system using context-sensitive management instructions.

BACKGROUND ART

Conventional audiovisual (AV) storage systems, e.g., media storage devices, allow users to record a great deal of media transmitted to a user, e.g., local for the user. Thus, for example, users can record media such as movies and television (TV) programs on a media recording device, such as a hard drive, conveniently located in their home. However, due to the large capacity of conventional hard drive units, an overwhelmingly large quantity of media can be recorded on the AV storage system. Given these facts, a need implicitly arises for a method to meaningfully manage the media content recorded on a media storage device local to the user.

It is common that conventional storage management is entirely dependent upon the user, who is then responsible for ensuring availability of sufficient resources for ongoing and future recording. Some conventional media storage devices can perform overwriting of a program, but this is based on viewing status ("already viewed") or temporal status ("oldest content is removed first"). However, this crude method of overwriting a program often fails to maintain the recorded programs the user truly wants. Thus a need arises for a media storage device that overcomes the limitations of conventional user-intensive storage methods.

Conventional media programs are recorded at some arbitrary location within a media storage device, e.g., at an arbitrary address within a hard drive portion of the media storage device. Interestingly, a media program is actually made up of many small clips of discrete media, e.g., audio/video clips. However, conventional media storage devices only allow the recording of, and overwriting of, the entire section of the program. That is, a user will instruct the media storage device that media program can be overwritten in its entirety. Thus, the conventional method provides an all or nothing approach to handling media stored on the media storage device.

While the entire program might not actually be overwritten in conventional methods, e.g., due to the fact that the new program is only 50% as long as the program being overwritten, the conventional devices and methods still provide only program-level granularity in the recording and overwriting instructions. This practice may result in the loss of a small clip, e.g., a 60 second content clip, of data that the user desires to maintain. Conversely, this practice may consume significantly more storage space than actually needed. For example, a user must consume storage space for the duration of the entire program to ensure retention of the small desired AV clip, according to the conventional program-granularity level of recording and storing. Additionally, the conventional process is wasteful of resources. For example, if only clip needs to be updated to make the entire program current, then the conventional process requires that the entire program be overwritten to capture the clip. Consequently, a need arises for a method to overcome the limitations of the conventional program-level granularity for recording and overwriting data on the media storage device.

One alternative to the conventional home entertainment system, e.g., a television coupled with an media storage device, is a so-called conventional personal computer (PC) audiovisual (AV) system. A PC AV system has more processor capabilities because it is a complete computer. However, the conventional download of files and content can a formidable quantity of files and data for a user to manage. Consequently, a need exists to provide the aforementioned improvements in media storage to a PC AV system or a home network storage system.

The present invention provides a method and apparatus for updating content in an audiovisual (AV) storage system. In particular, the present invention provides automated remote management of content stored in a local AV storage system, using context-sensitive instructions. Thus, the present invention provides a method of meaningfully managing the content, or data, recorded on the media storage device. That is, the present invention overcomes the limitations of a single-interaction paradigm of a user with the on-site media storage device. Furthermore, the present invention overcomes the limitations of the conventional media storage paradigm that requires frequent user input for managing storage space. The present invention also overcomes the problem of conventional overwriting methods and the limitations of the conventional program-level granularity for recording and overwriting data on the media storage device. The present invention is also applicable to a PC AV system or a home network storage system.

One embodiment of the present invention provides an audiovisual (AV) storage system capable of receiving automated remote context-sensitive management instructions for updating the media content stored on the AV storage system. In particular, the storage system, or storage device, for storing a multimedia signal includes a storage medium, such as a dedicated hard drive, a processor, and a memory. The storage medium is coupled to the processor and the memory. The memory contains instructions that, when implemented via the processor and other components, enables a method of automated remote management of data stored on the storage medium local to the user. The method includes several steps, including a first step of receiving a media signal with content data and context data, also referred to as metadata, at the media storage device. A subsequent step receives storage management instructions from a storage management provider. Lastly, the media signal is stored on the media storage device in accordance with the storage management instructions.

The method of the present embodiment also accommodates the following provision. The metadata can either be provided along with the content, or through other mechanisms, including on-line/Internet based data provision. The metadata contains references to related content, which may be obsolete, once the new content is available. For example: in a news broadcast context, a new story replaces an older story, given that they describe the same event. The metadata may also contain other information about the content, which enables the system to match the user preferences and to manage the available storage space. For example, the user may have requested to keep the most recent episode of a soap opera available. The metadata enables the system to identify previously stored episodes, and to keep only the most recent one.

These and other advantages of the present invention will become clear to those of ordinary skill in the art after having read the following detailed description of the preferred embodiments which are described herein.

BRIEF DESCRIPTION OF THE DRAWINGS

The accompanying drawings, which are incorporated in, and form a part of, this specification, illustrate embodiments of the invention and, together with the description, serve to explain the principles of the invention. The drawings referred to in this description should be understood as not being drawn to scale except as specifically noted.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Some portions of the detailed descriptions which follow, e.g., the processes, are presented in terms of procedures, logic blocks, processing, and other symbolic representations of operations on data bits within a computer or a digital system memory. These descriptions and representations are the means used by those skilled in the arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a processor. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels to be interpreted further in view of terms commonly used in the art. Unless specifically stated otherwise as apparent from the following discussions, it is understood that throughout discussions of the present invention, terms such as "receiving," "storing," "managing," "overwriting," "tailoring," "generating," "transmitting," "enabling," or the like, refer to the action and processes that can be implemented by an electronic device, that manipulates and transforms data. The data is represented as physical (electronic) quantities within components of the device, and is transformed into other data similarly represented as physical quantities within the device components, or computer system memories or registers, or other such information storage, transmission or display devices.

The following figures will describe how the present invention uses metadata to enable the context sensitive storage management. The metadata may be provided as part of the content, e.g., in an analogue TV broadcast through data inclusion in the vertical blanking interval (VBI) space, or in digital TV as separate data streams. The metadata may also be provided in advance or with a delay, e.g., through an on-line connection from a server maintained by the service provider. The content is uniquely identified in this case, to enable access to the related metadata on the server. The system can monitor new content storage and identify content which can be erased from the system without user interaction.

Figure 1:
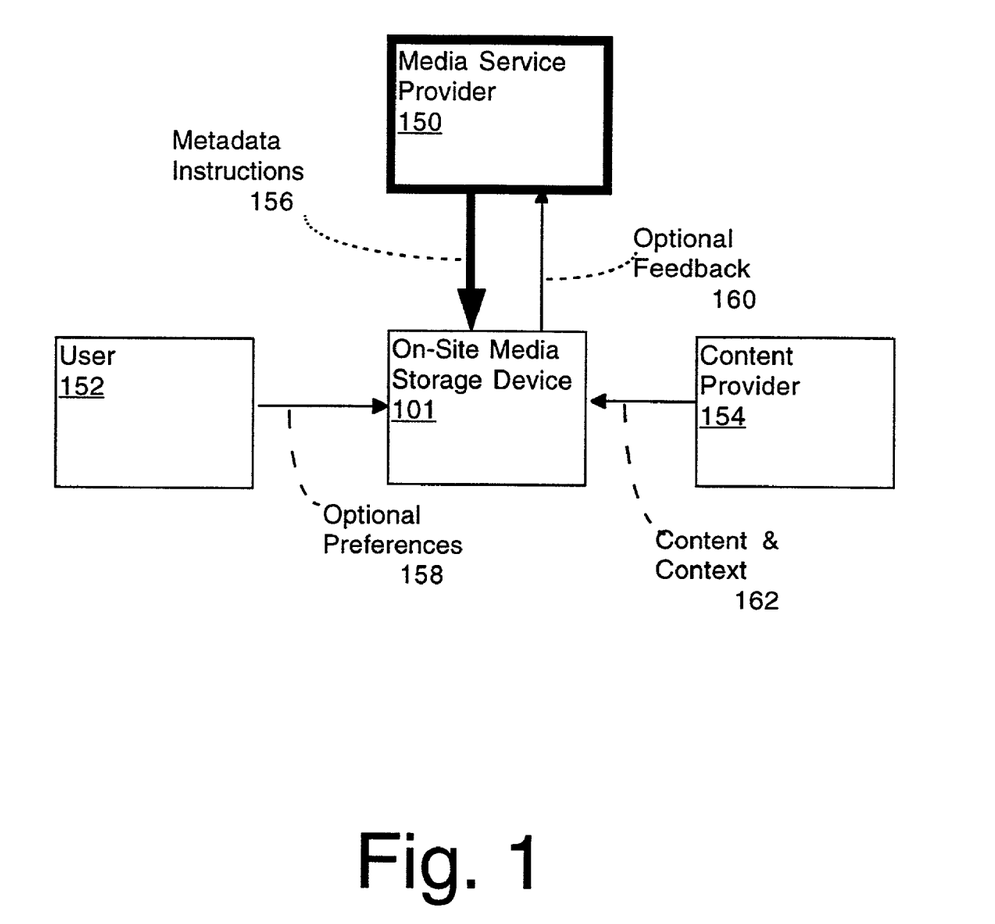
FIG. 1 is a block diagram of an on-site media storage device, a user, a media storage service provider, and a content provider, along with their interactions, in accordance with one embodiment of the present invention.

Referring now to FIG. 1, a block diagram of an on-site media storage device, a user, a media storage service provider, and a content provider, along with their interactions, is shown in accordance with one embodiment of the present invention. Block diagram 100 includes several entities that interact with each other via data and/or instructions. In particular, the center entity is an on-site media storage device 101, also referred to as AV storage system, that can be located on a user's premises. Media service provider 150, which is off-site in the present embodiment, provides storage management instructions and other content related data 156 to on-site media storage device 101 that will be used to manage the data already stored, or future data to be stored, in on-site media storage device 101. Off-site means that the storage management instructions can be generated at a site, e.g., the editorial news room of a content provider's production facility, apart from the location of the media storage device to be managed.

Still referring to FIG. 1, user 152 can provide optional preferences 158 to on-site media storage device 101. In return, on-site media storage device 101 can provide optional feedback 160 to media service provider 150. Optional feedback can include optional user preferences 158, statistics of a user's viewing habits, etc. Media service provider 150 can then adaptively modify management instructions 156, if desired, based on optional feedback 160 or some other criteria, e.g., advertiser preferences, etc. Content provider 154 provides content data and context data 162, also referred to as metadata, to on-site media storage device 101.

Compared to the conventional single-interaction paradigm, the present invention includes an additional entity, a media service provider 150, which is responsible for providing the storage management instructions to the on-site media storage device 101. Thus, user 152, is freed up from performing the tedious and often frustrating task of managing the data already stored, and the future data to be stored, on media storage device. The media storage service provider is a content provider, e.g., a broadcaster, in the present embodiment. However, the present invention is well-suited to using alternative sources for the media storage service provider, such as a dedicated third-party service provider that is independent of the content providers. Management instructions 156 may be provided via digital encoding in a digital TV broadcast signal, by Internet connection, by cable, satellite, or any other means of transmitting data. Furthermore, management instructions can be provided coincidental with the media signal to be recorded on the device, or prior to, or subsequent to, transmission of the media signal.

Figure 2A:
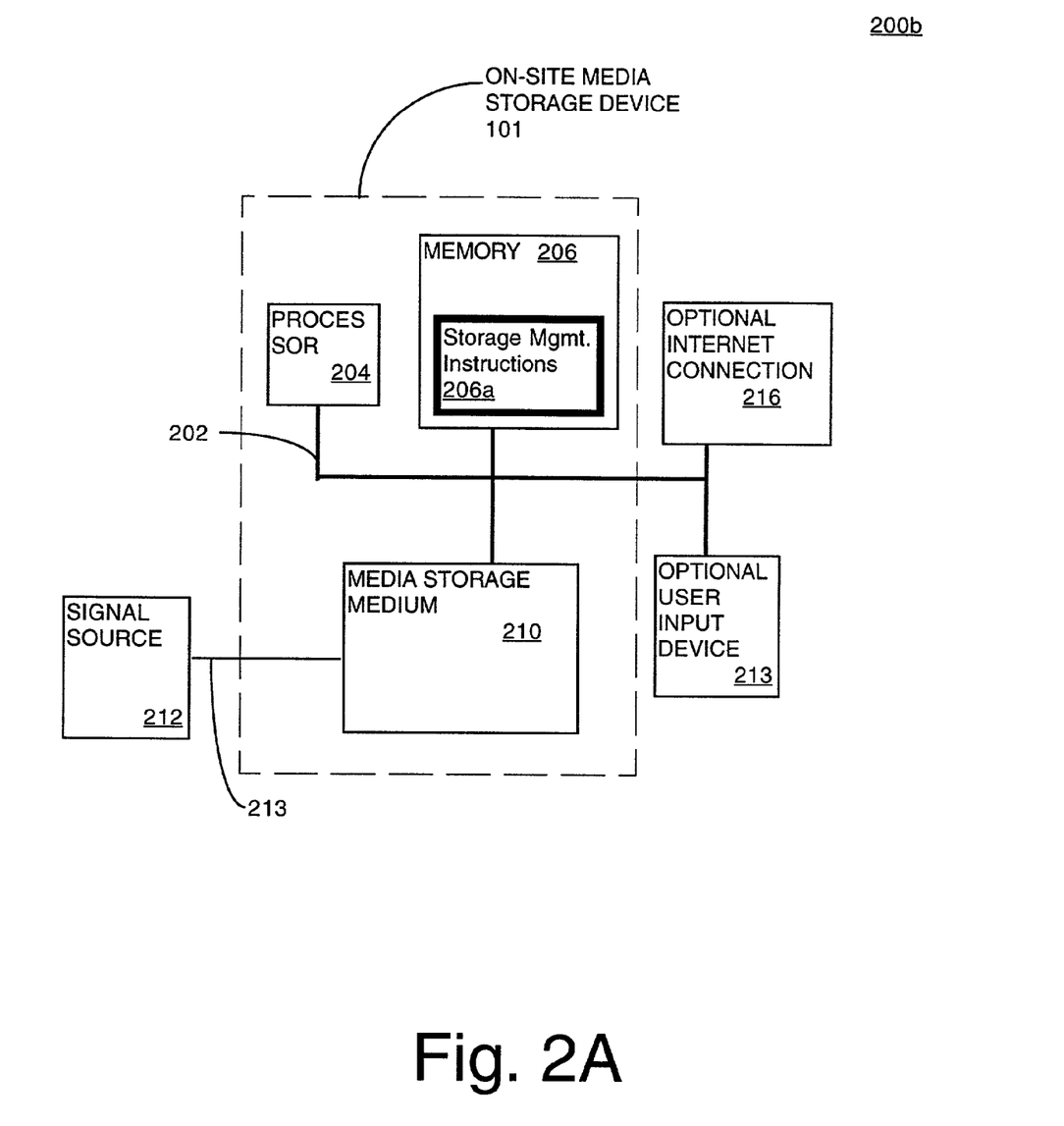
FIG. 2A is a block diagram of an on-site media storage system capable of receiving media management instructions and other content related data from a storage management provider, in accordance with one embodiment of the present invention.

Referring now to FIG. 2A a block diagram of an on-site media storage system capable of receiving media management instructions and other content related data from a storage management provider is shown, in accordance with one embodiment of the present invention. As a preface, on-site media storage device 101 is one embodiment of a larger information, or entertainment, system 200b which can also include a display device, a set-top box, and other components (not shown) to enhance the receiving, storing, processing, and display of media data.

On-site media storage device 101 of FIG. 2A includes a control/data bus 202 for communicating information, a processor unit 204 for processing information and instructions, coupled to bus 202, and a memory unit 206 for storing information and instructions, also coupled to bus 202. Memory unit 206 can be configured as random access memory (RAM), for storing temporal information and instructions for central processor unit 204, and/or read only memory (ROM), for storing static information and instructions for central processor unit 204. Media storage system 200b also includes a signal source 212, coupled to media storage medium 210 via connection 213 for providing a data signal. Media storage medium 210 is any type of medium that can store digital data. Some examples include a hard disk memory storage medium, compact disc (CD) read only memory (ROM) with either a read (CD-R) or a read/write (CD-R/W) configuration, or any other suitable medium. In the present embodiment, memory 206 contains storage management instructions 206a which are stored thereon. However, the present invention is well-suited to dynamically receiving instructions from the storage management service provider, and only temporarily buffering them in memory.

Signal source 212 can be any device, such as an antennae for receiving a broadcast, a cable interface for line transmission, or a dish for receiving satellite broadcast. While processor 204 and memory 206 are shown as individual entities, they may be incorporated into another component. For example, processor 204 and memory 206 may be dedicated components for on-site media storage device 101, and as such, can be located therein. Alternatively, processor 204 and memory 206 may be existing components in a display device, e.g., a digital television (DTV) (not shown), or in a set-top box (not shown).

On-site media storage system 200b also includes several optional components. For example, Internet connection 216 can be coupled to bus 202 for transmitting information to, and receiving information from, the Internet. As an example, Internet connection 216 can communicate metadata, complementing a content data signal, to media storage medium 210. Similarly, optional user input device 213, e.g., a keypad, remote control, etc., can be coupled to bus 202 in on-site media storage device 101. Optional user input device 213 can be used to provide communication between on-site media storage device 101 and a user.

Bus 202 provides an exemplary coupling configuration of devices in on-site media storage device 101. Bus 202 is shown as a single bus line for clarity. However, it is appreciated by those skilled in the art that bus 202 can include subcomponents such as data lines and/or control lines for the communication of commands and/or data between appropriate devices. It is further appreciated by those skilled in the art that bus 202 can be a parallel configuration, a serial configuration, or an IEEE 1394 configuration, and that bus 202 can include numerous gateways, interconnects, and translators, as appropriate for a given application.

It is also appreciated that on-site media storage system 200b and on-site media storage device 101 are exemplary and that the present invention can operate within a number of different media systems, including a consumer-based home entertainment system, a commercial media system, a general purpose computer system, etc. Furthermore, the present invention is well-suited to using a host of intelligent devices that have similar components as exemplary on-site media storage device 101. Likewise, while the present embodiment shows a single media storage management block 210 for centrally locating all stored programs, regardless of the content provider that provided the program, the present invention is well-suited to using alternative configurations. For example, the present invention is well-suited to using a bank of dedicated tuner-disk pairs, each dedicated to the media provided by a single content provider. Additional details of the so-called dedicated tuner-disk pair is provided in Co-pending U.S. patent application Ser. No. 09/524,770, entitled "A Service Module And A Method For Providing A Dedicated On-Site Media Service" by Rob Myers et al. This related application is commonly assigned, and is hereby incorporated by reference.

Figure 2B:
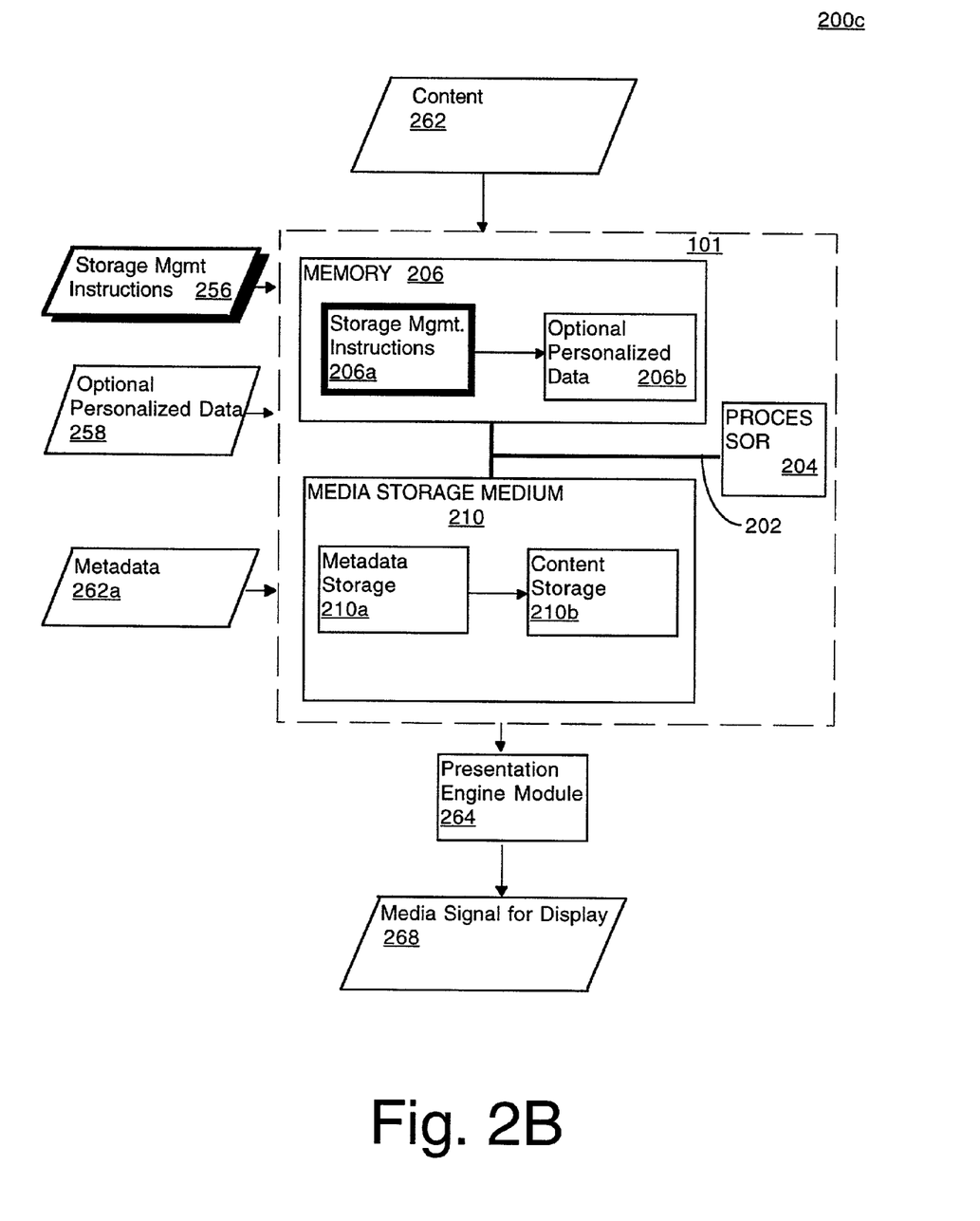
FIG. 2B is a block diagram of the on-site media storage device and its interface with inputs, that provide the data and instructions stored on the memory, and with output, in accordance with one embodiment of the present invention.

Referring now to FIG. 2B, a block diagram of the on-site media storage device and its interface with inputs, that provide the data and instructions stored on the memory, and with output is shown, in accordance with one embodiment of the present invention. FIG. 2B essentially provides a more specific embodiment of a portion of the on-site media storage device of FIG. 2A. That is, block diagram 200c shows the interface between on-site media storage device 101 and Input/Output blocks, shown in trapezoid shapes. Storage management instructions 156 are input to memory 206, as mentioned in FIG. 2A. Optional personalized data 258 is also input into memory 206, via hardware components shown in FIG. 2A. Storage management instructions 206a, as well as optional personalized data 206b, can be stored in on-site media storage device 101.

Still referring to FIG. 2B, content data 262 is input to on-site media storage device 101 e.g., via signal source 212 of FIG. 2A. Content data 262 is evaluated by storage management instructions 206a, tempered by optional personalized data 206b, and then either transmitted to, or filtered from, media storage medium 210. If content data 262 and/or metadata 262a is passed into media storage medium 210, then they can be stored in segregated portions of memory, e.g., metadata storage 210a, and content storage 210b, coupled by an appropriate memory address link or database system. Content and/or metadata information can be transmitted directly from media storage medium 210 to an optional Presentation Engine Module 264, and then output as a media signal 268 for a display unit. Presentation Engine module 264 is capable of splicing together many discrete AV clips, based on user preferences, to create a composite viewer-tailored program.

Figure 3:
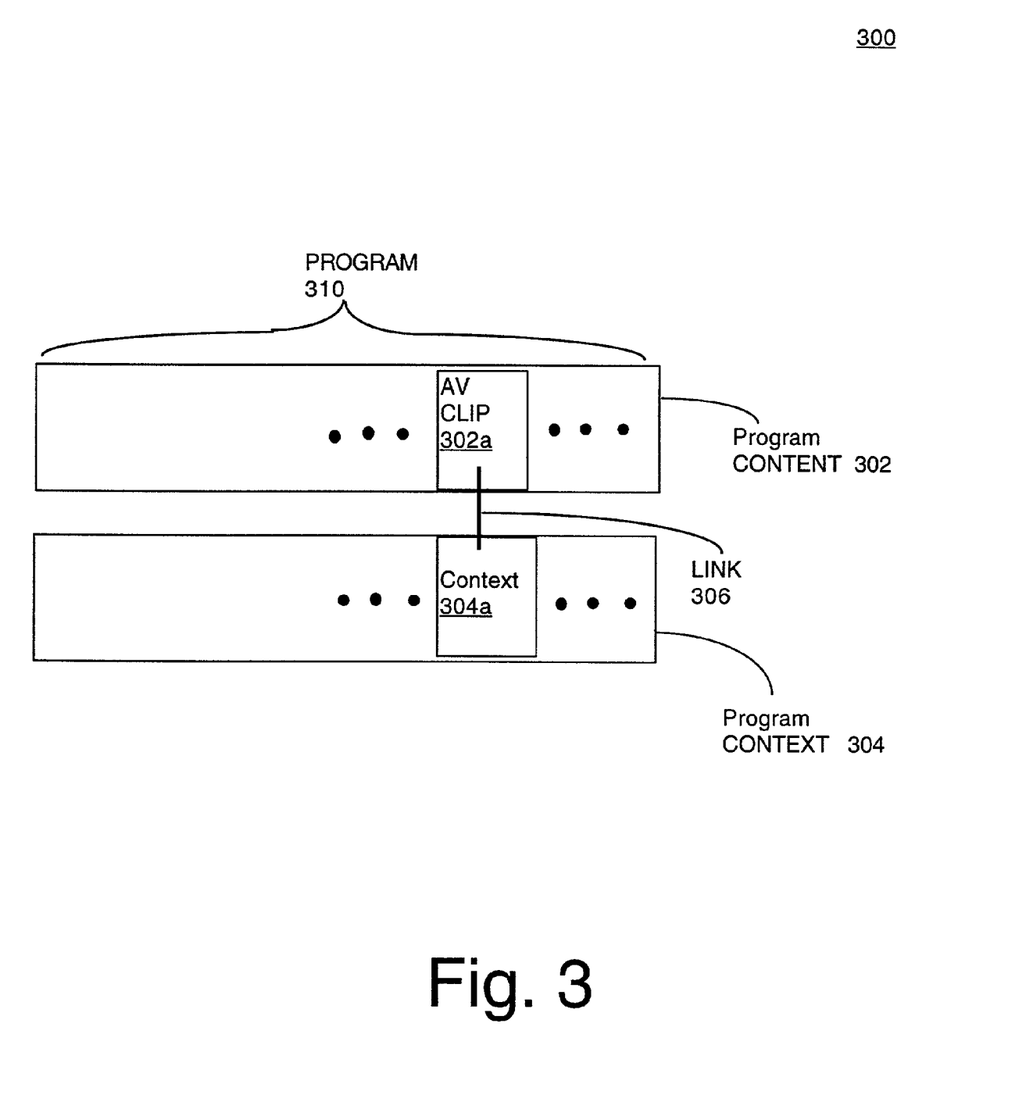
FIG. 3 is a block diagram of a media clip of content data, and its associated context data, located within a TV program, in accordance with one embodiment of the present invention.

Referring now to FIG. 3 a block diagram of a media clip of content data, and its associated context data, located within a TV program is shown, in accordance with one embodiment of the present invention. TV program has a time span 310 that includes content data 302 and associated context data 304, also referred to as metadata. Time span 310 is shown as a spatially linear layout of data. Typically, a media program, e.g., a sitcom or a news broadcast, is made up of many small clips of audiovisual (AV) data. Content clip 302a is an example of a small clip of content data, e.g., a 60 second long clip of AV data. Content clip 302a is tagged with a complementary context data clip 304a that describes its content. Content clip 302a and context clip 304a are tied, e.g., by a link 306, which can be a database link, a cross-reference in a memory address lookup table, collaterally-stored data, or any one of many possible indexing schemes for tying the two portions of data together.

As shown in FIG. 3, one embodiment of the present invention implements storage management instructions on a fine-granularity basis, e.g., management of clips as short as the shortest AV clip/context clip pairs created by the content provider. Thus, the present invention can update portions of a program, e.g., a news program, incrementally and discretely. For example, weather or stock news may be updated throughout the day while the main headline story remains the same. One skilled in the art can appreciate the many different management schemes possible with fine-grain storage management of media data.

Figure 4:
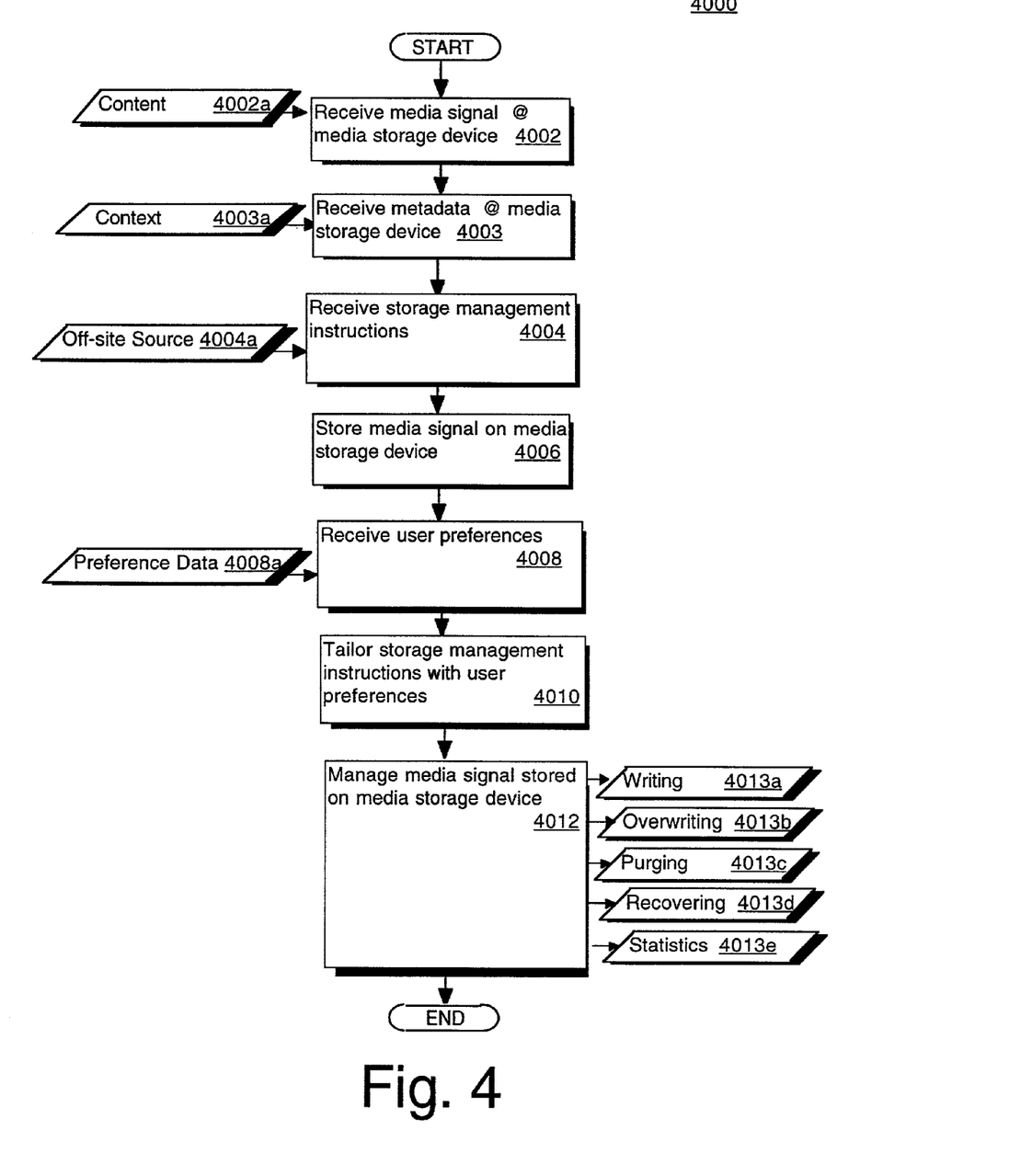
FIG. 4 is a flowchart of a process that implements automated storage management instructions in an on-site media storage device, in accordance with one embodiment of the present invention.

Referring now to FIG. 4, a flowchart of a process that implements automated storage management instructions in an on-site media storage device is shown, in accordance with one embodiment of the present invention. By using flowchart 4000 embodiment, the present invention enables automated context-sensitive management of data on an on-site media storage device. The resulting system is user-friendly, flexible, and provides a content provider with a certain amount of influence over what media is storable for a given user. Furthermore, the resulting system provides the viewer with the interactive features necessary to meet his/her needs. While flowchart 4000 embodiment of the present invention is implemented using exemplary on-site media storage device 101 of FIG. 2A, the present invention is well-suited to implementing flowchart 4000 on a wide range of electronic devices. For example, an on-site PC with the appropriate equipment, e.g., similar to FIG. 2A, may be used to implement steps applied to an on-site media storage device. Indeed, as TVs acquire processors and memory and as PCs acquire TV tuners cards, the two systems can appear to approach a common configuration.

Flowchart 4000 begins with step 4002. In step 4002 of the present embodiment, a media signal is received at a media storage device. Media signal input can include content data input 4002a. Step 4002 is implemented, in one embodiment, by on-site media storage device 101 of FIG. 2B. Different components of FIG. 2B can be used to accommodate step 4002. For example, content portion 4002a of a media signal can be received by signal source 212. Alternatively, content portion 4002a of data can be received on optional Internet connection 216. Following step 4002, flowchart 4000 proceeds to step 4003.

In step 4003 of the present embodiment, context (metadata) data input 4003a is received at the media storage device. Step 4003 is implemented, in one embodiment, by on-site media storage device 101 of FIG. 2A. Different components of FIG. 2A can be used to accommodate step 4002. For example, content portion 4002a of a media signal can be received by signal source 212 in the same media signal as the content data. In another embodiment, context data 4006b can be received by alternative delivery mediums, such as optional Internet connection 216. While the present embodiment indicates that receipt of content data 4002a occurs prior to receipt of context data 4003a, the present invention is well suited to many alternatives. For example, the context data 4003a can be received before, during, or after the receipt of the receipt of the content data 4002a. Following step 4003, flowchart 4000 proceeds to step 4004.

In step 4004 of the present embodiment, storage management instructions are received at the media storage device. Input 4004a provides the storage management instructions from an off-site source. Input 4004a can be received by any source, such as optional Internet connection 216, as indicated in FIG. 2A. It is the receipt of management instructions from a source other than the user, or viewer, of the on-site media storage device, that enables the automated, hands-off, context-sensitive storage management of the present invention. While the present embodiment indicates that receipt of storage management instruction step 4004 occurs after receipt of media signal step 4002, the present invention is well suited to many alternatives. For example, the storage management instructions can be received before or during the receipt of the receipt of the media signal. Following step 4004, flowchart 4000 proceeds to step 4006.

In step 4006 of the present embodiment, media signal is stored on media storage device. Media signal can contain content data, e.g., from input 4002a and context (metadata) data, e.g., from input 4003a. Step 4006 is implemented, in one embodiment, by media storage medium 210 of FIGS. 2A and 2B, and its alternatives. Following step 4006, flowchart 4000 proceeds to step 4008.

In step 4008 of the present embodiment, user preferences are received. As previously noted, user preferences are useful to enhance and personalize the storage management instructions provided by a media storage service provider. However, they are not required by the present invention. Personal preference data can be stored in a portion of memory, e.g., portion 206b of FIG. 2B. Following step 4008, flowchart 4000 proceeds to step 4010.

In step 4010 of the present embodiment, storage management instructions are tailored with respect to user preferences. As shown in FIG. 2B, storage management instructions 206a are linked with optional personalized data 206b. Thus, given the option by the storage management service provider, a user can have a certain degree of flexibility and choice in deciding content, context, update, overwrite, etc. storage issues of the on-site media storage device. Step 4010 is implemented, in one embodiment, by an interaction of storage management instructions and personal preferences, both stored in memory 206, and executed by processor 204, as shown by on-site media storage device 101 of FIG. 2A. Following step 4010, flowchart 4000 proceeds to step 4012.

In step 4012 of the present embodiment, media signal received and/or stored in on-site media storage device, is managed according to the storage management instructions. Step 4012 is accomplished by the tailored storage management instructions provided by step 4010. The step of managing a received content and context portion of a media signal can include writing management 4013a. Writing management 4013a include decisions such as what portion of the context and content signal should be recorded, and which should be discarded. Writing management 4013a also implicitly include overwriting management 4013b, which includes decisions such as what portion of existing stored data should the new data overwrite. Thus, for example, a received media signal containing updated weather data may be overwritten on the previous day's weather data. However, one particular user preferences may request the on-site media storage device to maintain an archive of weather reports for personal reasons. Similar examples can be provided for sports broadcasts, instructional programs, etc.

Notably, step 4012 of the present invention can allow the storage management of fine-grain clips of context and content, as described in FIG. 3. Other management blocks evaluated by step 4012 include purging management 4013c of an on-site media storage device, e.g., by a storage management service provider. One example of this issue would be purging data following a season of televised programming, or temporal updating the passing of a given season, e.g., fall viewing season, or the passing of a calendar year, e.g., at the start of the new year. The last management block shown for step 4012 is recovery management 4013d. Priorities can be established for which portions of data, according to context or some other variable, are overwritten first or last. In this manner, possibly important data can be saved for overwriting last, thus providing a "buffer" for the recovery of data deemed potentially important by optional user input, or by storage management service provider. Step 4012 is implemented, in one embodiment, by on-site media storage device 101 of FIG. 2A.

Step 4012 also includes a management block of statistics management 4013e of an on-site media storage device, e.g., by a storage management service provider. Statistics management block 4013e can provide valuable statistical information between a user and a content provider, such as accuracy or relevance of storage management service versus optional user preferences. Following step 4012, flowchart 4000 ends.

Figure 5:
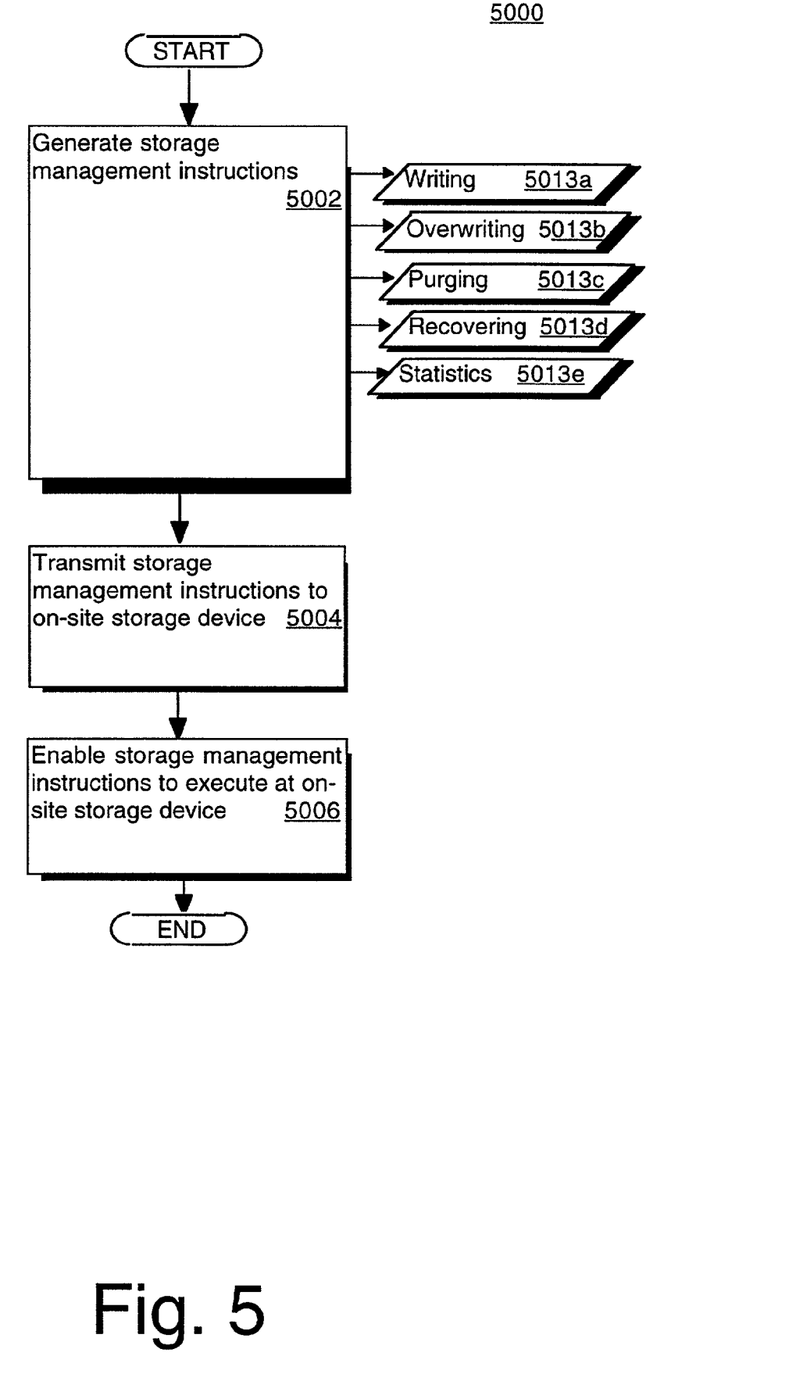
FIG. 5 is a flowchart of a process that generates management instructions by a storage management provider for subsequent use in an on-site media storage device, in accordance with one embodiment of the present invention.

Referring now to FIG. 5, a flowchart of a process that generates management instructions by a storage management provider for subsequent use in an on-site media storage device is shown, in accordance with one embodiment of the present invention. By using flowchart 5000 embodiment, the present invention provides the storage management instructions that can be transmitted to a user's on-site media storage device.

Flowchart 5000 begins with step 5002. In step 5002 of the present embodiment, storage management instructions are generated. In one embodiment, the storage management instructions are generated by the editorial staff of a content provider, e.g., the program staff at a broadcasting company. The editorial staff is capable of programming decisions, foresight, etc., to the essentially "dumb" conventional on-site media storage device. Alternatively, a storage management service provider, independent of any content provider, can provide across-the-board storage management services for the on-site media storage device.

Step 5002 is implemented, in one embodiment, by generating of explicit or general instructions for respective types of programming, e.g., news, sports, sitcoms, instructional, etc. Step 5002 of FIG. 5 should provide the complementary instructions necessary to accommodate the management blocks identified in step 4012 of FIG. 4. Thus, management instructions can provide specific instructions for any of the following management blocks: writing issues 5013a, overwriting management 5013b, purging management 5013c, recovery management 5013d, and statistics management 5013e. The present invention is well-suited to a very wide range of storage management instructions other than those provided in this step. Following step 5002, flowchart 5000 proceeds to step 5004.

In step 5004 of the present embodiment, management instructions are transmitted to on-site storage device. Step 5004 is implemented, in one embodiment, by block 250 of FIG. 2A. Step 5004 is open to a complementary embodiment of the many embodiments provided for reception of management instructions by the on-site media storage device. Thus, for example, if an on-site media storage device is capable of receiving the management instructions over the optional Internet connection, then the transmission of the management instructions can originate at an Internet connection of the storage management service provider. Following step 5004, flowchart 5000 proceeds to step 5006.

In step 5006 of the present embodiment, the storage management instructions are enabled to be executed at the on-site storage device. Enablement of the instructions can be accomplished by any of several means. For example, some instructions are only enabled upon valid subscription to a given content provider, e.g., a sports news content broadcaster. Thus, while any user would be able to view the given service, storage management instructions would only allow subscribers to record the content. Alternatively, storage management instructions can written such that upon receipt at the on-site media storage device, they become executable. Finally, one embodiment can provide a user with the power to execute the desired features of the storage management instructions. Following step 5006, flowchart 5000 ends.

While flowcharts 4000 and 5000 of the present embodiment shows a specific sequence and quantity of steps, the present invention is suitable to alternative embodiments. For example, not all the steps provided for flowchart 4000 are required for the present invention, e.g., the user preference step 4008. Furthermore, additional steps can be added to the steps presented in the present embodiment. Likewise, the sequence of the steps can be modified depending upon the application. While flowcharts 4000 and 5000 are shown as a single serial process, it can also be implemented as a continuous or parallel process. The embodiments disclosed herein can also be used to enhance a video-on-demand system based on a local AV storage.

Many of the instructions for the steps, and the data input and output from the steps of flowcharts 4000 and 5000 are implemented utilizing memory 206 and utilizing processor 204, as shown in FIG. 2. Memory storage 206 of the present embodiment can include both permanent memory, such as read only memory (ROM), and temporary memory such as random access memory (RAM). ROM memory can be utilized to store data for permanent functions of the dedicated service module, while RAM memory can be utilized to store data related to the on-site media service data. Memory 206 can include other types of memory storage, capable of containing data, such as a hard drive, a CD ROM, or flash memory. Furthermore, processor 204 can either be a dedicated controller, an existing system processor, or it can be a dedicated digital signal processing (DSP) processor. Alternatively, the instructions can be implemented using some form of a state machine.

In view of the embodiments described herein, the present invention provides a method and apparatus for updating content in an audiovisual (AV) storage system. In particular, the present invention provides automated remote management of content stored in an on-site AV storage system with context-sensitive instructions. Thus, the present invention provides a method to meaningfully manage the content, or data, recorded on the media storage device, thereby overcoming the limitations of a single-interaction paradigm of a user with the on-site media storage device. Furthermore, the present invention overcomes the limitations of the conventional media storage paradigm that requires frequent user input for providing storage space. The present invention also overcomes the problem of conventional overwriting methods and the limitations of the conventional program-level granularity for recording and overwriting data on the media storage device. The present invention is also applicable to a PC AV system or a home network storage system.

The foregoing descriptions of specific embodiments of the present invention have been presented for purposes of illustration and description. They are not intended to be exhaustive or to limit the invention to the precise forms disclosed, and naturally many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A media storage device implementing a method of enabling automated management of data stored on said media storage device, said method comprising:
   receiving content data at said media storage device;
   receiving context data at said media storage device, wherein said content data and said context data update part of an audiovisual program stored on the media storage device;
   receiving executable storage management instructions from a media service provider that, when executed, perform automated management of said media storage device without requiring user input;
   storing said content data and said context data on said media storage device in accordance with said storage management instructions;
   identifying previously stored content data at said media storage device as being outdated using said received context data; and
   replacing said previously stored content data with said received content data.

2. The media storage device recited in claim 1 wherein said media storage device is comprised of:
   a processor coupled to said storage medium; and
   a computer readable memory coupled to said processor and containing program instructions stored therein that, when executed, implement said method of enabling automated management of data stored on said storage medium.

3. The media storage device recited in claim 1 wherein said storage management instructions are transmitted by a storage management service provider located remotely from said media storage device.

4. The media storage device recited in claim 1, wherein the method further comprises:
   managing said content data and said context data stored on said media storage device according to said storage management instructions.

5. The media storage device recited in claim 4 wherein said storage management instructions provide context-sensitive management of said content data stored on said media storage device.

6. The media storage device recited in claim 1, wherein the method further comprises:
   allowing overwriting of new content data over content data recorded onto said media storage device in accordance with said storage management instructions.

7. The media storage device recited in claim 1, wherein the method further comprises:
   receiving user preference data from an on-site user.

8. The media storage device recited in claim 7, wherein the method further comprises:
   tailoring said storage management instructions with respect to said user preferences.

9. The media storage device recited in claim 1 wherein said storage management instructions are adaptively updated.

10. The media storage device recited in claim 1 wherein said storage management instructions are capable of managing a discrete context-content clip of data.

11. A method of managing an on-site media storage device, said method comprising:
    generating executable storage management instructions for said on-site media storage device, said storage management instructions, when executed, automate management of data stored on said on-site media storage device without requiring user input, wherein said storage management instructions are context-sensitive, identify previously stored content data that is part of an audiovisual program at said on-site media storage device as being outdated using context data, and replace said previously stored content data with a received content data; and
    transmitting said management instructions to said on-site media storage device.

12. The method recited in claim 11 further comprising:
    enabling said storage management instructions to execute on said on-site media storage device.

13. The method recited in claim 11 wherein said storage management instructions are provided by a storage management service provider located remotely from said on-site media storage device.

14. The method recited in claim 11 wherein said storage management instructions are capable of said automated management of a media signal without requiring input from a user.

15. The method recited in claim 11 further comprising enabling said allowing overwriting of a new media signal onto said content data and said context data stored on said on-site media storage device in accordance with said storage management instructions.

16. The method recited in claim 11 wherein said storage management instructions are capable of interpreting user preference data from an on-site user of said on-site media storage device.

17. The method recited in claim 16 further comprising:
    tailoring said storage management instructions with respect to said user preferences.

18. The method recited in claim 11 wherein said storage management instructions are adaptively updated.

19. The method recited in claim 11 wherein said storage management instructions are capable of managing a discrete context-content clip of data.

20. The method recited in claim 11 wherein said context data is received at said on-site media storage device.

21. A non-transitory computer readable medium containing therein, computer readable codes for causing an electronic device to implement a method of managing on-site storage, said method comprising
    generating executable storage management instructions for an on-site media storage device, said storage management instructions operable for automated management of data stored on said on-site media storage device without requiring user input, wherein said storage management instructions are context-sensitive, identify previously stored content data that is part of an audiovisual program at said on-site media storage device as being outdated using context data, and replace said previously stored content data with a received content data; and transmitting said storage management instructions to said on-site media storage device.

22. The non-transitory computer readable medium recited in claim 21 further comprising:

enabling said storage management instructions to execute on said on-site media storage device.

23. The non-transitory computer readable medium recited in claim 21 wherein said storage management instructions are provided by a storage management service provider.

24. The non-transitory computer readable medium recited in claim 21 wherein said storage management instructions are capable of said automated management of a media signal without requiring input from a user.

25. The non-transitory computer readable medium recited in claim 21 further comprising allowing overwriting of a new media signal onto content data recorded onto said media storage device in accordance with said storage management instructions.

26. The non-transitory computer readable medium recited in claim 21 wherein said storage management instructions are capable of interpreting user preference data from a on-site user of said on-site media storage device.

27. The non-transitory computer readable medium recited in claim 25 further comprising:

tailoring said storage management instructions with respect to said user preferences.

28. The non-transitory computer readable medium recited in claim 21 wherein said storage management instructions are adaptively updated.

29. The non-transitory computer readable medium recited in claim 21 wherein said storage management instructions are capable of managing a discrete context-content clip of data.

30. The non-transitory computer readable medium recited in claim 21 wherein said storage management instructions are integrated with said media signal.

31. A method comprising:

receiving and storing a program at a media storage device, wherein the program comprises a plurality of clips;

receiving an updated version of a particular one of the plurality of clips;

receiving executable storage management instructions at the media storage device, wherein the storage management instructions instruct the media storage device to create an updated version of the program by using received context data associated with the particular one of the plurality of clips to update the stored program with the updated version of the particular one of the plurality of clips, and wherein the storage management instructions instruct the media storage device to store the updated version of the program, and wherein said storage management instructions instruct the media storage device to identify previously stored content data at the media storage device as being outdated using said received context data; and automatically executing the received storage management instructions without requiring a user input.

32. The method of claim 31, further comprising:

outputting the program from the media storage device before receiving the updated version of the particular one of the plurality of clips; and outputting the updated version of the stored program from the media storage device.

33. The non-transitory computer readable medium recited in claim 21 wherein said context data is received at said on-site media storage device.

* * * * *